United States Patent
Suwa et al.

(10) Patent No.: US 7,634,391 B2
(45) Date of Patent: Dec. 15, 2009

(54) IBIS CORRECTION TOOL, IBIS CORRECTION METHOD, AND WAVEFORM SIMULATION DEVICE

(75) Inventors: Yuji Suwa, Kawasaki (JP); Jiro Yoneda, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 407 days.

(21) Appl. No.: 11/583,889

(22) Filed: Oct. 20, 2006

(65) Prior Publication Data

US 2007/0185699 A1    Aug. 9, 2007

(30) Foreign Application Priority Data

Feb. 8, 2006   (JP) ............................. 2006-031486

(51) Int. Cl.
*G06F 17/10* (2006.01)
(52) U.S. Cl. .................. 703/2; 703/18; 716/5
(58) Field of Classification Search ............ 703/2, 703/13, 14, 18; 716/4, 5, 18; 382/149
See application file for complete search history.

(56) References Cited

U.S. PATENT DOCUMENTS 7,136,797 B2 * 11/2006 Tosaka et al. .................. 703/14
7,395,519 B2 * 7/2008 Kawata ........................... 716/4
2007/0006104 A1 * 1/2007 Kawata ........................... 716/4

FOREIGN PATENT DOCUMENTS

JP           2003-271692           9/2003

OTHER PUBLICATIONS

Fan et al. J. Modeling DC Power-Bus Structures with Vertical Discontinuities Using a Circuit Extraction Approach Based on a Mixed-Potential Integral Equation Formulation, IEEE Transactions on Advanced Packaging, vol. 24, Iss. 2, May 2001, pp. 143-157.*

* cited by examiner

*Primary Examiner*—Russell Frejd
(74) *Attorney, Agent, or Firm*—Kratz, Quintos & Hanson, LLP

(57) ABSTRACT

An IBIS correction tool which can be used assembled in a waveform simulation device and corrects IBIS data for a certain specific power supply voltage V0 to IBIS data for a desired power supply voltage V1 with a higher precision than the past, that is, an IBIS correction tool configured so as to read IBIS data for a power supply voltage V0 as numerical data of x-y coordinates at a data input unit, find a relative ratio (correction coefficient) between this numerical data and numerical data for a power supply voltage V1 on its x-y coordinates at a correction coefficient calculating unit, and obtain corrected IBIS data corrected for the power supply voltage V1 according to that correction coefficient at a corrected IBIS data generating unit.

9 Claims, 9 Drawing Sheets

IBIS CORRECTION TOOL, IBIS CORRECTION METHOD, AND WAVEFORM SIMULATION DEVICE

BACKGROUND OF THE INVENTION

1. Field of the Invention

The present invention relates to, as one preferred example of application, a waveform simulation device for simulating an output waveform exhibited by a semiconductor device, more particularly relates to an input/output buffer information specification (IBIS) correction tool installed in the waveform simulation device etc. and an IBIS correction method.

2. Description of the Related Art

In recent years, LSIs and other semiconductor integrated circuits have been increasingly growing in circuit size. Simulators using computers are therefore becoming indispensable for their circuit design and circuit analysis. Among such simulators, the present invention particularly relates to a waveform simulation device for simulating the output waveforms of the basic components of semiconductor integrated circuits, that is, CMOS devices or other semiconductor devices as one preferred example of application. In further detail, an IBIS correction tool for correcting IBIS data provided from the outside of a modeling unit (explained later)— one of the principal components forming the waveform simulation device.

Note that as known art relating to the present invention, there is the Japanese Patent Publication (A) No. 2003-271692. An object of Japanese Patent Publication (A) No. 2003-271692 is, in the same way as the present invention, to obtain a desired precision in circuit simulation. In order to attain this object, this provides "simulation program with integrated circuit emphasis (SPICE) parameters used in circuit simulation of a semiconductor integrated circuit, wherein the SPICE parameters include sets of SPICE parameters divided for means using SPICE parameters expressing the entire range of a power supply voltage region and means using SPICE parameters expressing a low Vgs region of a gate-source voltage". Japanese Patent Publication (A) No. 2003-271692 is different in configuration from the present invention explained later.

Regarding the IBIS data, this IBIS data is data expressing a so-called device model. This device model is usually comprised of data expressing an electrical characteristic of the output, that is, the voltage-current characteristic of the output, obtained by actual measurement or simulation for each semiconductor device. The output voltage-current characteristic data forming this device model is provided from for example the LSI manufacturer producing the semiconductor device.

In this case, that output voltage-current characteristic data is provided as data obtained under a certain specific power supply voltage as a representative voltage, that is, output voltage-current characteristic data corresponding to only one specific power supply voltage. This is because in recent semiconductor devices, the range of usable power supply voltage has grown greatly, so it has become difficult for the LSI manufacturer to provide the output voltage-current characteristic data under each power supply voltage over the entire range of the usable power supply voltage.

This being the case, a user requiring an output voltage-current characteristic under his desired power supply voltage (for example 2.8V) different from the above specific power supply voltage (for example 3.3V) cannot use the IBIS data for the specific power supply voltage provided for the semiconductor device as it is.

For this reason, conventionally, in the case of the above-described example, the user has simply shifted the provided output voltage-current characteristic curve by 0.5 (=3.3−2.8) V and used that as a substitute for the IBIS data for the desired power supply voltage (3.3V) (explained later with reference to the drawings).

However, when performing the simple voltage shift explained above for the above correction, there is the problem that, in part of the above-described output voltage-current characteristic, there is a part which ends up deviating from the output voltage-current characteristic obtained by actual measurement or simulation. Error occurs there, so corrected IBIS data corresponding to the above-described desired power supply voltage cannot be obtained with a high precision.

In this case, it is also naturally possible to extract the output voltage-current characteristic data per se for that desired power supply voltage by actual measurement or simulation. However, enormous time and cost are required for such actual measurement or simulation, so this is not realistic.

SUMMARY OF THE INVENTION

Accordingly, in consideration of the above-described problem, an object of the present invention is to provide an IBIS correction tool and an IBIS correction method able to generate corrected IBIS data corrected so as to match with any desired power supply voltage different from a specific power supply voltage in a short time and with a high precision based on the IBIS data for the specific power supply voltage and a waveform simulation device provided with this IBIS correction tool.

To attain the above object, an IBIS correction tool of the present invention is configured so as to read IBIS data for a power supply voltage V0 as numerical data of x-y coordinates at a data input unit (11), find a relative ratio (correction coefficient) between this numerical data and numerical data for a power supply voltage V1 on its x-y coordinates at a correction coefficient calculating unit (12), and obtain corrected IBIS data corrected for the power supply voltage V1 according to that correction coefficient at a corrected IBIS data generating unit (13).

BRIEF DESCRIPTION OF THE DRAWINGS

There and other objects and features of the present invention will be more apparent from the following description of the preferred embodiments given with reference to the accompanying drawings, wherein.

DESCRIPTION OF THE PREFERRED EMBODIMENTS

Preferred embodiments of the present invention will be described in detail below while referring to the attached figures.

Figure 1:
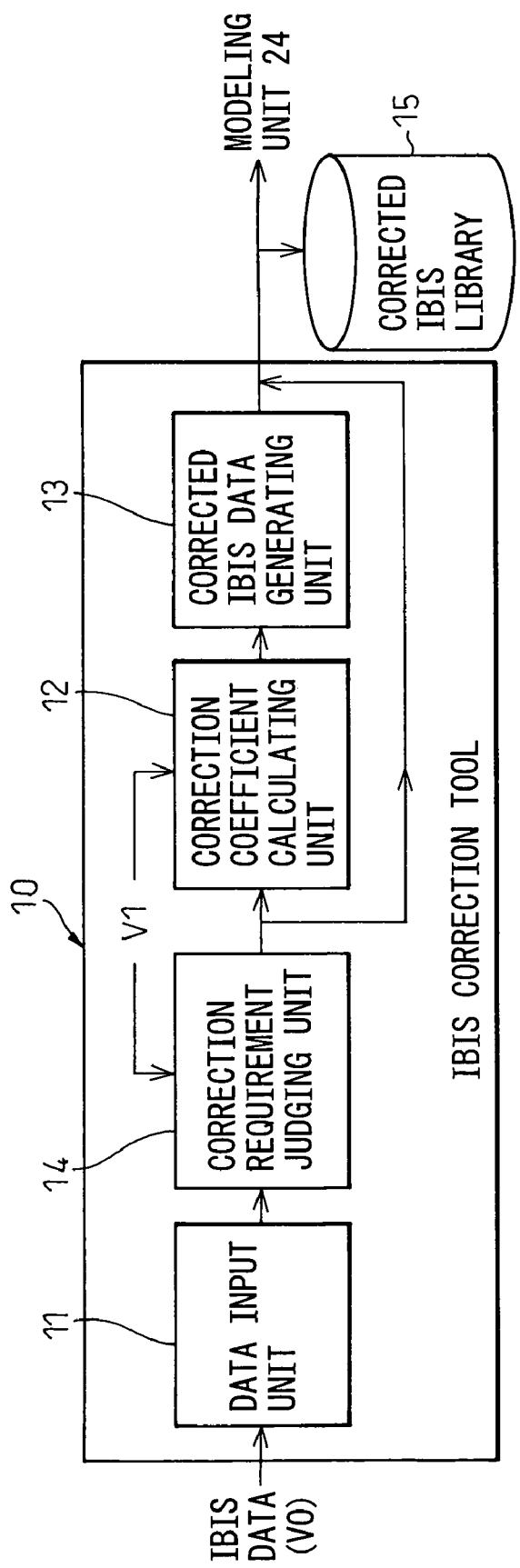
FIG. 1 is a diagram showing a basic configuration of an IBIS correction tool according to the present invention.

FIG. 1 is a diagram showing the basic configuration of an IBIS correction tool according to the present invention. In the figure, reference numeral 10 indicates an IBIS correction tool which is basically configured by illustrated data input unit 11, correction coefficient calculating unit 12, and corrected IBIS data generating unit 13. Note that, other than these, a correction requirement judging unit 14 and a corrected IBIS library 15 will be explained later.

This correction tool 10 is for converting IBIS data (V0) provided for a certain specific power supply voltage (for example V0) for a certain semiconductor device to corrected IBIS data corrected so as to match with a desired power supply voltage (for example V1) different from that specific power supply voltage for that semiconductor device. That IBIS data (V0) is input to the data input unit 11.

This data input unit 11 reads all data on the output electrical characteristic (output voltage-current characteristic) of the semiconductor device defined by the above IBIS data (V0) as numerical data of x-y coordinates. Next, the correction coefficient calculating unit 12 calculates a relative ratio of the numerical data of the x-y coordinates read at the data input unit 11 for the specific power supply voltage V0 and the numerical data represented on the same x-y coordinates for the desired power supply voltage V1 as a correction coefficient. Further, the corrected IBIS data generating unit 13 converts the IBIS data corresponding to the specific power supply voltage V0 on the x-y coordinates to the corrected IBIS data corrected so as to match with the desired power supply voltage V1 according to the calculated correction coefficient.

Figure 2:
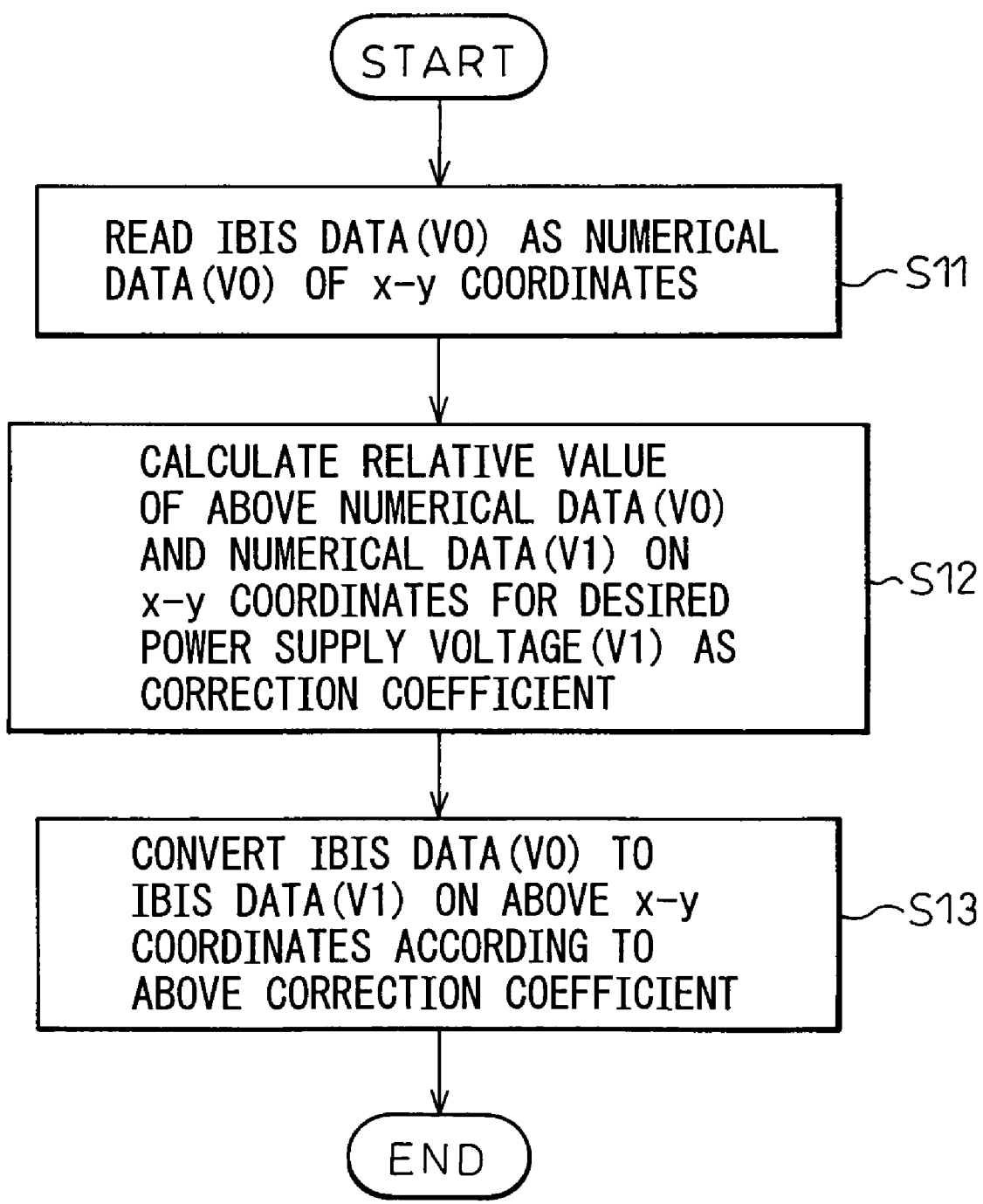
FIG. 2 is a flow chart of an IBIS correction method according to the present invention.

FIG. 2 is a flow chart showing the IBIS correction method according to the present invention. The IBIS correction method represented by the present flow chart is, as explained, a method for converting the IBIS data provided for a certain specific power supply voltage (V0) for a certain semiconductor device to corrected IBIS data corrected so as to match with the desired power supply voltage (V1) different from that specific power supply voltage for that semiconductor device. Here, at a first step S11, all data for the output electrical characteristic (output voltage-current characteristic) of the semiconductor device defined by the IBIS data is read as the numerical data of the x-y coordinates. At a second step S12, the relative ratio between the numerical data of the x-y coordinates read at the first step S11 for the above specific power supply voltage and the numerical data represented on the same x-y coordinates for the above desired power supply voltage V1 is calculated as the correction coefficient. At a third step S13, according to the correction coefficient calculated at the second step S12, on the above x-y coordinates, the IBIS data corresponding to the above specific power supply voltage V0 is converted to the corrected IBIS data corrected so as to match with the above desired power supply voltage V1.

Figure 3:
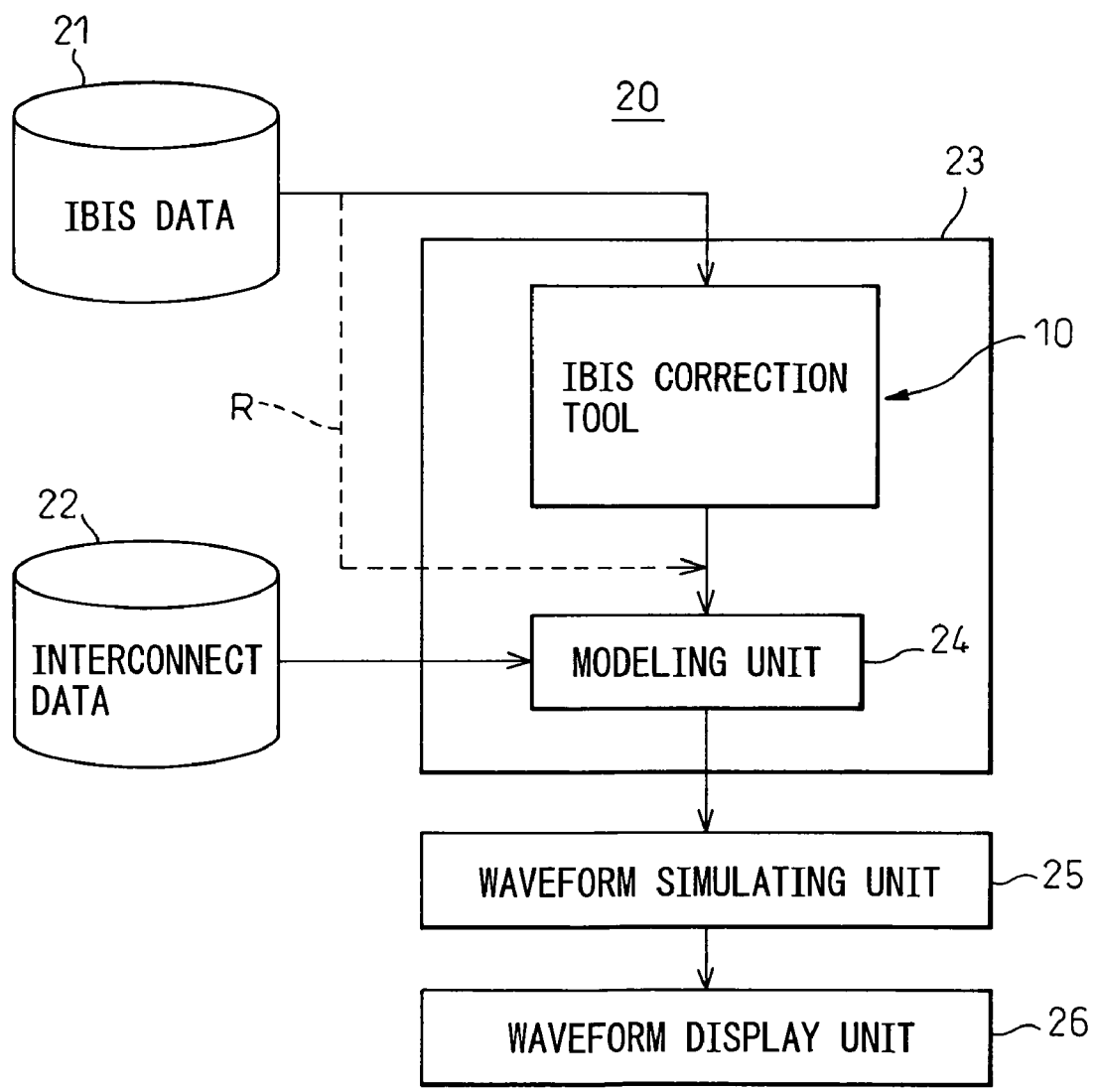
FIG. 3 is a diagram showing a waveform simulation device provided with the IBIS correction tool according to the present invention.

FIG. 3 is a diagram showing a waveform simulation device provided with the IBIS correction tool according to the present invention. In the figure, reference numeral 20 indicates the waveform simulation device according to the present invention. This is substantially the same as the existing waveform simulation device except for the IBIS correction tool 10 (FIG. 1) in this. Note that, throughout all figures, the same reference numerals or symbols are attached to the same components.

Namely, if output data from an IBIS data file 21 storing IBIS data (output electrical characteristic) is directly input to a modeling unit 24 along a dotted line R, this is substantially the same as the existing waveform simulation device. Note that the IBIS data file 21 is paired with an interconnect data (interconnect CAD) file 22 for use.

Accordingly, an existing waveform simulation device is configured by a modeling unit 24 receiving as input IBIS data and interconnect data provided from the outside and preparing a device model and an interconnect model, a waveform simulating unit 25 receiving as input information of the device model and interconnect model prepared in this modeling unit 24 and simulating an output waveform of the semiconductor device, and a waveform display unit 26 for providing the simulated output waveform to a user, therefore the waveform simulation device 20 according to the present invention is characterized by the following.

First, a model generating unit 23 including the modeling unit 24 is formed. The IBIS correction tool 10 is introduced to the input side of the IBIS data in this model generating unit 23. Here, the IBIS correction tool 10 converts the IBIS data provided for a certain specific power supply voltage (V0) for a certain semiconductor device to corrected IBIS data corrected so as to match with a desired power supply voltage (V1) different from that specific power supply voltage for that semiconductor device.

Figure 11:
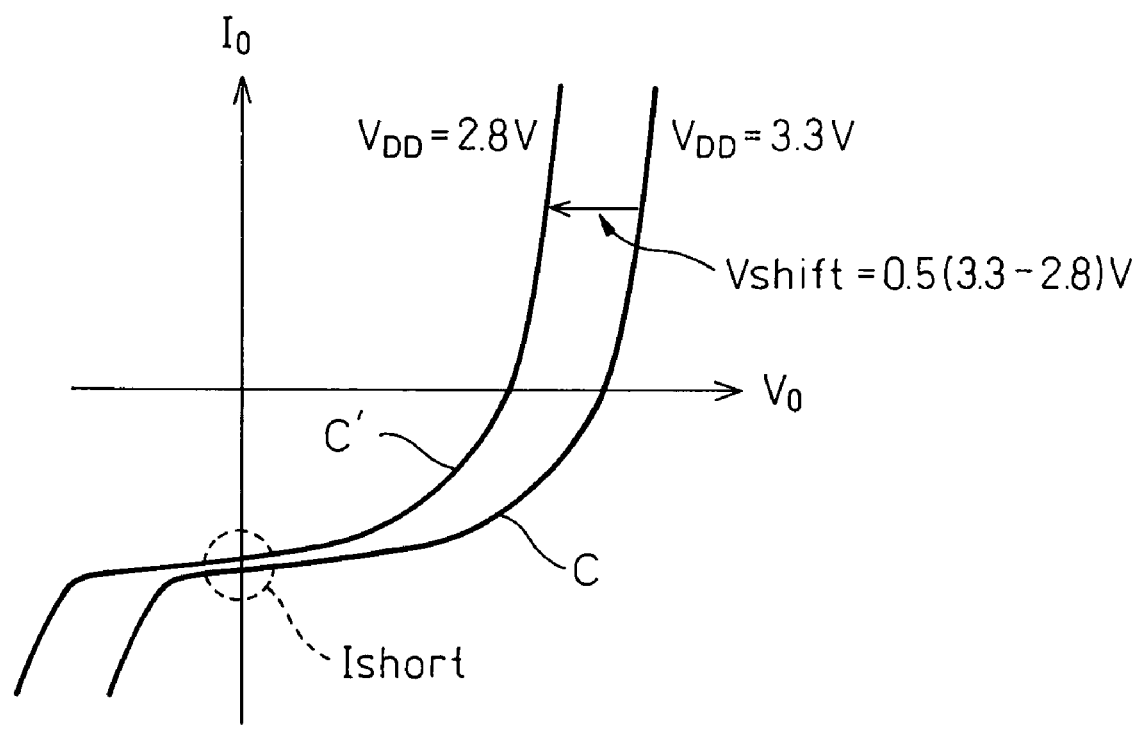
FIG. 11 is a diagram for explaining the correction of an output electrical characteristic curve according to a prior art method.

As explained before, conventionally, in for example a case where IBIS data for a specific power supply voltage of 3.3V was provided and the user required IBIS data corresponding to a desired power supply voltage of for example 2.8V different from that specific power supply voltage, an operation of simply re-forming the output voltage-current characteristic curve provided by the IBIS data to an output voltage-current characteristic curve simply shifted by 0.5 (=3.3−2.8) V along the voltage direction to match the same with 2.8V was carried out (see FIG. 11 explained later).

According to the above-explained simple technique, however, error (Er) is produced in part of the output voltage-current characteristic curve (see FIG. 7 explained later).

According to the present invention, due to the corrected IBIS data, in the case of the above-described example, the IBIS data can be converted to more accurate IBIS data corresponding to the desired power supply voltage of 2.8V, so the above error is eliminated (see FIG. 7 explained later). In this case, only the simple arithmetic operations (11, 12, 13) as shown in FIG. 1 are introduced, therefore in comparison with the generation of the IBIS for that 2.8V power supply voltage by actual measurement or simulation, a corrected IBIS which is more accurate than the past can be obtained in a much shorter time and at a much lower cost.

In order to clearly understand the effects according to the present invention, first of all, the related art will be explained.

Figure 9:
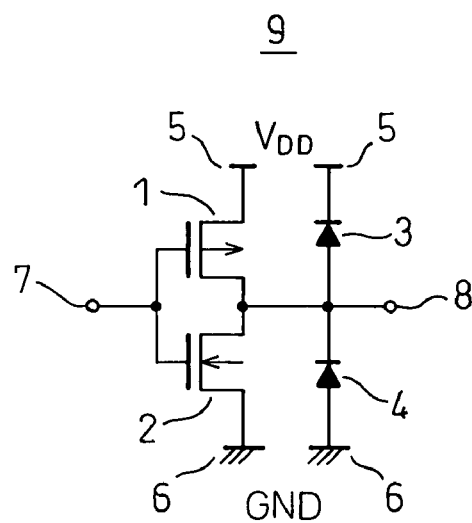
FIG. 9 is a diagram showing an example of a semiconductor device covered by the present invention.

FIG. 9 is a diagram showing an example of a semiconductor device covered by the present invention. The semiconductor device according to this example is a general output circuit of an LSI, that is, a CMOS device. Note that, other than this, the present invention can be applied to a case of for example a transistor-transistor logic (TTL) circuit or an emitter coupled logic (ECL) circuit.

In FIG. 9, reference numeral 9 represents a CMOS device as the previously explained semiconductor device, 1 is a high side drive use P channel MOS FET, and 2 is a low side drive use N channel MOS TFT. An output buffer is formed by these P-MOS FET1 and N-MOS FET2.

The input side of this output buffer (1, 2) has an input terminal 7, while the output side thereof has an output terminal 8. A power supply voltage terminal 5 and a GND use terminal 6 given the above specific power supply voltage (V0) or desired power supply voltage (V1) are provided. Note that reference numerals 3 and 4 are a high side protection diode and low side protection diode.

The present invention relates to the IBIS data of the CMOS device 9, that is, the output electrical characteristic (output voltage-current characteristic) at the output terminal 8. This will be illustrated as shown in FIG. 10.

Figure 10:
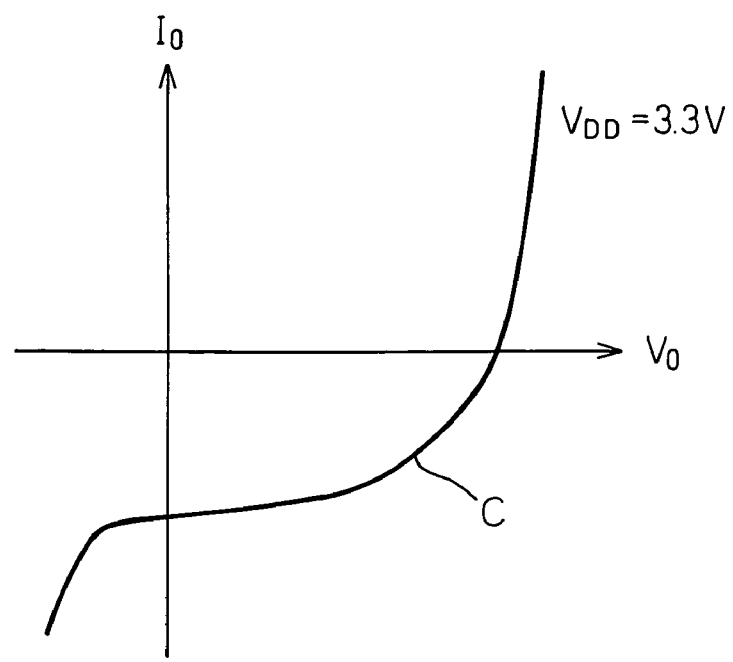
FIG. 10 is a diagram showing an output voltage-current characteristic focused on in the present invention.

FIG. 10 is a diagram showing the output voltage-current characteristic focused on in the present invention for the CMOS device 9 of FIG. 9. Particularly, this shows the output electrical characteristic at the output terminal 8 when the high side drive use P channel MOS FET1 becomes ON for a case where the power supply voltage ($V_{DD}$) is 3.3V. Note that an output voltage Vo is plotted on an abscissa, and an output current Io is plotted on an ordinate. In FIG. 9, when the low side drive use N channel MOS FET2 is ON (that is, when the P channel MOS FET1 is OFF), the power supply voltage does not appear at the output terminal 8, therefore it is not necessary to consider the correction of the IBIS data.

When the IBIS data (output voltage-current characteristic) for a specific power supply voltage ($V_{DD}$) of 3.3V is provided from the LSI manufacturer etc. as shown in FIG. 10 and the user of the CMOS device 9 desires to for example use the power supply voltage 2.8V for the CMOS device 9 of FIG. 9, conventionally the output voltage-current characteristic curve C shown in FIG. 10 was simply shifted in the voltage direction by 0.5 (=3.3−2.8)V. This will be shown by the figure as follows.

FIG. 11 is a diagram for explaining the correction of the output electrical characteristic curve according to the conventional method. In the figure, reference symbol C indicates the output voltage-current characteristic curve for the specific power supply voltage (3.3V) provided by the LSI manufacturer etc. for the CMOS device 9 in the same way as shown in FIG. 10.

In order to change this characteristic curve C for use for the desired power supply voltage (2.8V), conventionally the user simply shifted that curve C by 0.5V (Vshift=0.5V) to obtain a replacement use output voltage-current characteristic curve C' for 2.8V based on this curve C' as the input data (device model) to the modeling unit 24.

However, it is clear from FIG. 11 that a short current Ishort (current when output voltage Vo=0) in the output current Io is the same between the time of the characteristic curve C (3.3V) and the time of the characteristic curve C' (2.8V). That is, both at the time of the power supply voltage 3.3V and the time of 2.8V, the values of the short current Ishort become almost the same. This is impossible in actual measurement, so with the conventional correction method, error is clearly included and accurate corrected IBIS data is not obtained.

The present invention takes note of the fact that when viewing the graph of FIG. 11 as x-y coordinates, a first quadrant is relatively accurately corrected, but in a fourth quadrant, accurate correction is inherently impossible by the above-described voltage shift method (Vshift). Therefore, first, it handles the output voltage-current characteristic as numerical data of coordinates (x, y), finds a relative ratio of magnitudes of a vector at the time of 3.3V and a vector at the time of 2.8V going toward the voltage Vo=0V and current Io=0A, that is, the origin of the x-y coordinates, and performs an arithmetic operation according to this relative ratio to calculate the output voltage-current characteristic curve at the time of 2.8V. This calculation method will be explained with reference to the drawings.

Figure 4:
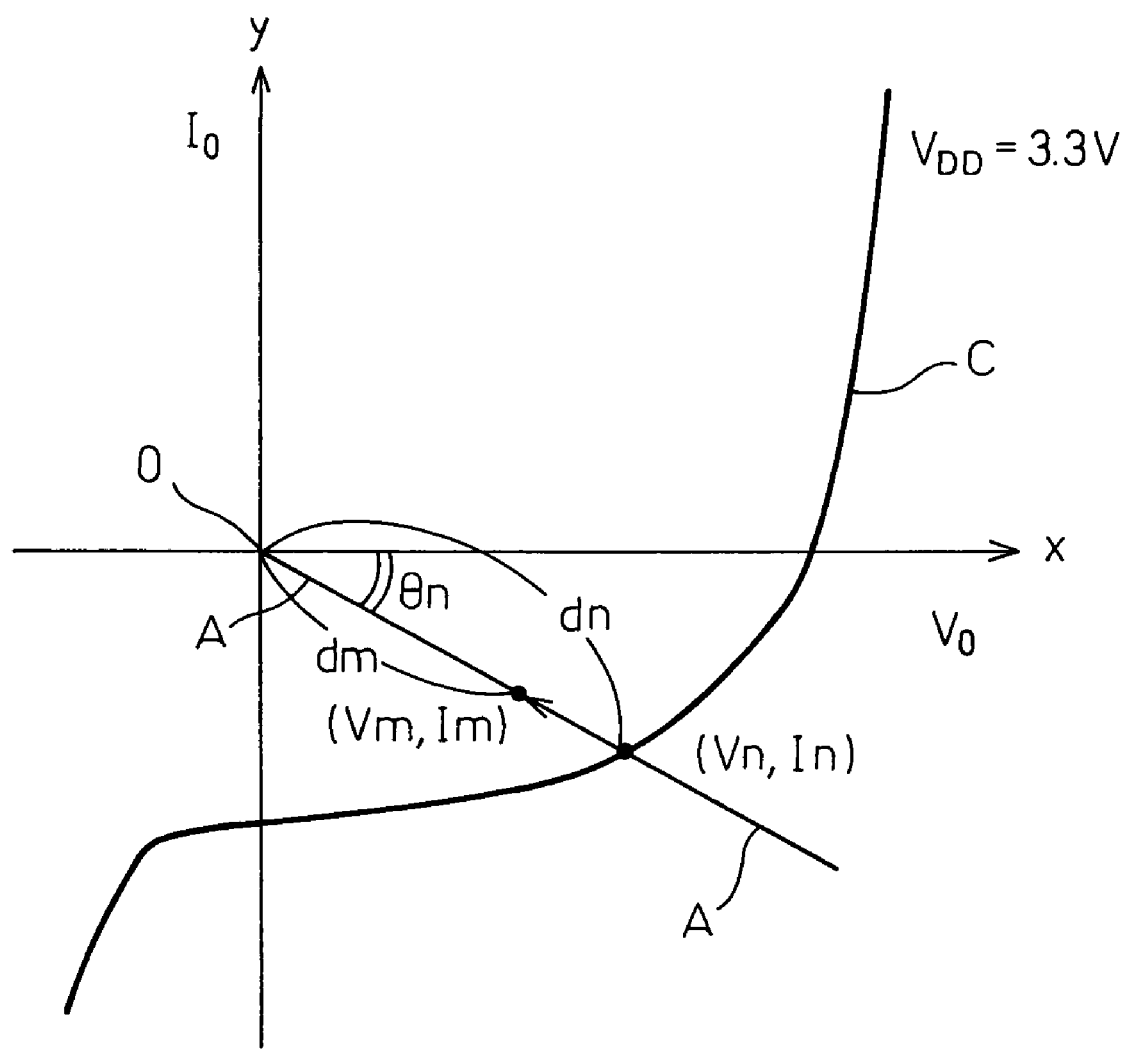
FIG. 4 is a diagram for explaining arithmetic operations for IBIS data correction based on the present invention.

FIG. 4 is a diagram for explaining the arithmetic operation for the IBIS data correction based on the present invention. In the figure, the output voltage-current characteristic curve C is obtained by plotting the IBIS data under 3.3V explained before on the x-y coordinates. The (x, y) numerical data on the characteristic curve C thereof is represented by (Vn, In). Many (n=1, 2, 3, ...) (Vn, In) are provided from the IBIS data, but one among these is illustrated for simplification.

In the present invention, with respect to this (Vn, In), an auxiliary line A passing through the origin 0 is drawn. Then, on this auxiliary line A, (Vm, Im) at the time of 2.8V corresponding to (Vn, In) at the time of 3.3V is found by vector computation. Note that the magnitude of the vector at this time is dn for (Vn, In) and dm for (Vm, Im), and the direction (angle) of the vector is θn.

When the auxiliary line A is drawn corresponding to each (Vn, In) at the time of 3.3V, each (Vm, Im) at the time of 2.8V is found by the arithmetic operation. By plotting them, the accurate output voltage-current characteristic curve data at the time of 2.8V are sequentially calculated. The calculation steps will be further specifically explained.

Referring to FIG. 4 described above and the already explained FIG. 1, the correction coefficient calculating unit 12 (FIG. 1) represents the large number of numerical data of the x-y coordinates read at the data input unit 11 (FIG. 1) as a reference vector (magnitude of dn, angle of θn) using the origin 0 of the x-y coordinates as the base point and uses the relative ratio between the magnitude (dm) of the vector corresponding to the desired power supply voltage (2.8V) on the x-y coordinates, that is, the desired vector, and the magnitude (dn) of the reference vector as the correction coefficient. The corrected IBIS data generating unit 13 (FIG. 1) converts the IBIS data corresponding to the specific power supply voltage (3.3V) to the corrected IBIS data corresponding to the desired power supply voltage (2.8V) based on the correction coefficient and the angle (θn) of the reference vector relative to the origin 0. Explaining these calculation steps in further detail, the data input unit 11 (FIG. 1) reads the specific power supply voltage as Vddn (3.3V), the output voltage thereof as Vn, and the output current thereof as In for the electrical characteristic of the output. The correction coefficient calculating unit 12 (FIG. 1) calculates the magnitude dn of the reference vector as $dn=\sqrt{(Vn^2+In^2)}$ and calculates the angle θn of the reference vector relative to the origin 0 as $\theta n=\tan^{-1}(In/Vn)$ and, when the desired power supply voltage is Vddm (2.8V), finds the above explained relative ratio as Vddm/Vddn.

Further, the corrected IBIS data generating unit 13 (FIG. 1) first calculates the magnitude dm of the desired vector as dm=(Vddm/Vddn)×dn and generates the output voltage Vm and the output current Im as the corrected IBIS data corresponding to the desired power supply voltage (2.8V) as Vm=dm×cos θn and Im=dm×sin θn. The above steps will be explained shown in the figures.

Figure 5:
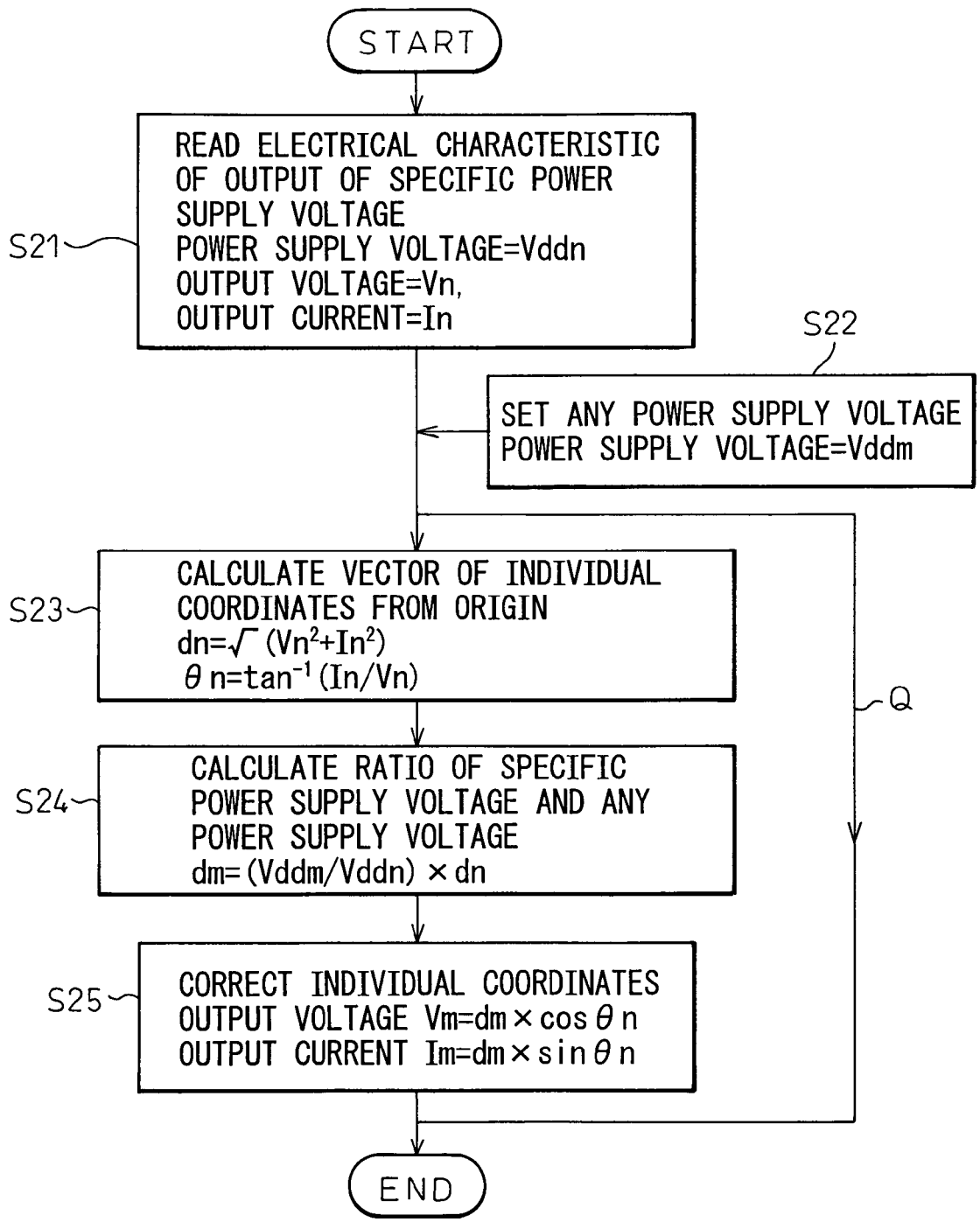
FIG. 5 is a flow chart of detailed computation operation of the correction tool based on the present invention.

FIG. 5 is a flow chart of a detailed computation operation of the correction tool based on the present invention. In the figure, at the first step S21, the data input unit 11 reads Vddn, Vn, and In.

At the second step S22, the correction coefficient calculating unit 12 is set at Vddm (V1 of FIG. 1 and 2.8V in the above-described example). If that Vddm is equal with Vddn, correction is unnecessary, therefore the process of the correction tool is ended as it is (route Q).

At the third step S23, the correction coefficient calculating unit 12 calculates the magnitude dn and the angle θn for the above-described reference vector and, at the fourth step S24, finds the relative ratio Vddm/Vddn.

At this fourth step S24, the corrected IBIS data generating unit 13 finds the magnitude dm of the vector of the desired power supply voltage (Vddm) from the above-described dn and Vddm/Vddn, and at the fifth step S25, the IBIS data generating unit 13 further calculates Vm and Im to be finally found as the numerical data on the x-y coordinates from dm×cos θn and dm×sin θn.

Figure 6:
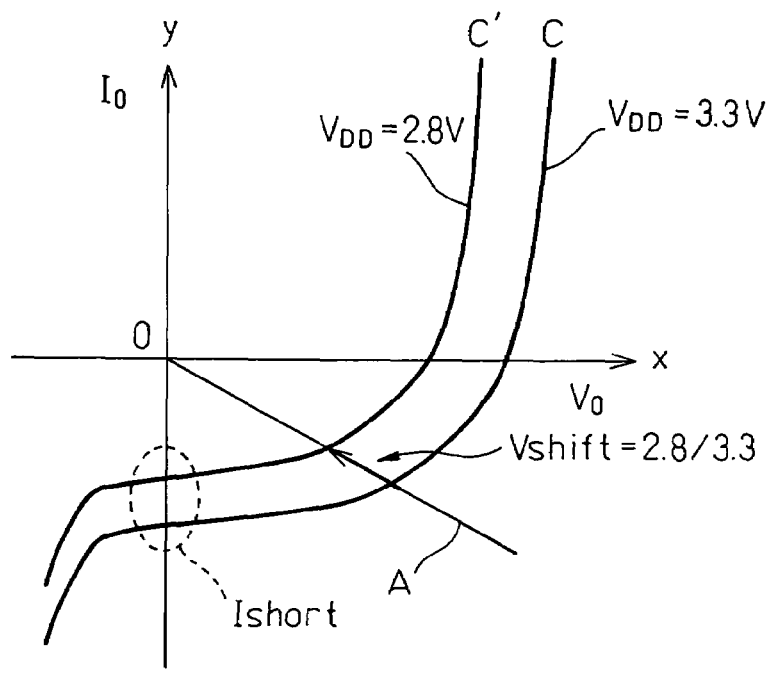
FIG. 6 is a diagram showing an output voltage-current characteristic curve C' corrected by an IBIS correction tool according to the present invention.

The results obtained by the function of the IBIS correction tool 10 explained with reference to FIG. 4, FIG. 5, and FIG. 1 described above are represented on the graph of FIG. 4 as shown in FIG. 6. Namely, FIG. 6 is a diagram showing the output voltage-current characteristic curve C' corrected by the correction tool 10 according to the present invention. The explained voltage shift Vshift (=0.5V) shown in FIG. 11 becomes Vshift (relative ratio)=2.8/3.3 on the auxiliary line A in FIG. 6.

The point to note in FIG. 6 is that, as apparent from the comparison with FIG. 11 explained before, the short currents Ishort show clearly different values in the case of the curve C and the case of the curve C', so it is understood that the correction according to the present invention is more accurate than the conventional case. This can be confirmed by FIG. 7.

Figure 7:
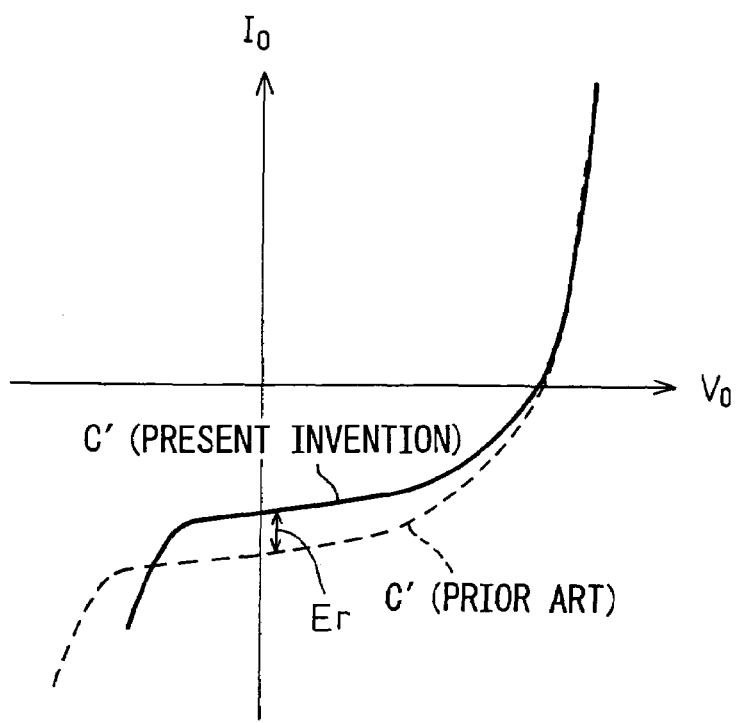
FIG. 7 is a diagram showing the characteristic curves C' representing the corrected IBIS data in the present invention and the conventional device in comparison.

FIG. 7 is a diagram showing characteristic curves C' representing the corrected IBIS data for a comparison of the present invention and the prior art. In FIG. 11, the inaccuracy of the short current Ishort was explained. The error representing the inaccuracy is indicated as Er in FIG. 7. Note that, in the first quadrant of FIG. 7, there is no difference between the curve C' (present invention) and the curve C' (prior art). It is seen that sufficiently accurate correction can be carried out by the aforesaid conventional simple voltage shift for this first quadrant.

The correction tool 10 explained in detail above can be assembled in various simulators. One example thereof is as shown in FIG. 3, that is, assembly in the waveform simulation device 20. This is shown in FIG. 8 in the form of functional blocks.

Figure 8:
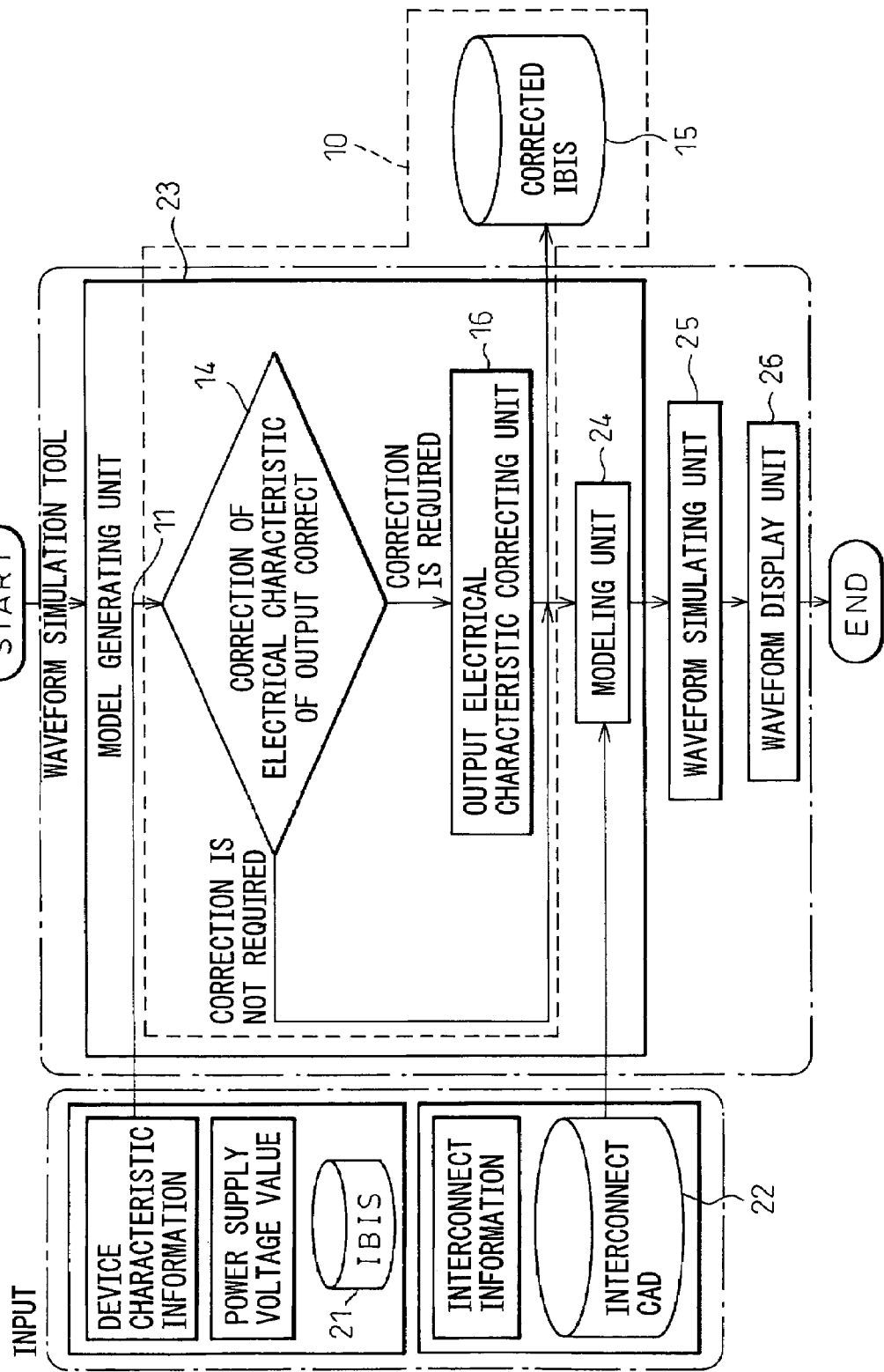
FIG. 8 is a functional block diagram of a waveform simulation device according to the present invention.

FIG. 8 is a functional block diagram of the waveform simulation device according to the present invention. In the figure, components corresponding to FIG. 1 and FIG. 3 will be indicated by the same reference numerals or symbols.

In FIG. 8, in "INPUT" on the left end, the device characteristic information including the IBIS data file 21 is provided from the outside (for example, the LSI manufacturer). On the other hand, the content of the interconnect data (interconnect CAD) file 22 is determined based on the design of the user itself.

The information from the "INPUT" is input to the model generating unit 23 in the waveform simulation tool. After the modeling by the modeling unit 24, as explained in FIG. 3, simulation is carried out at the waveform simulating unit (SPICE etc.) 25. The results thereof are displayed on a display or other waveform display unit 26 and provided to the user.

In FIG. 8, the portion according to the present invention is indicated by reference numeral 10. This is the above-explained correction tool. The "output electrical characteristic correcting unit" 16 in this correction tool 10 shows the correction coefficient calculating unit 12 and the corrected IBIS data generating unit 13 of FIG. 1 as one set. The operation thereof is as explained in detail in FIG. 4 to FIG. 7. Further, portions corresponding to the correction requirement judging unit 14 and the corrected IBIS library 15 shown in FIG. 1 are indicated by attaching the same 14 and 15 in FIG. 8.

The correction requirement judging unit 14 in FIG. 1 and FIG. 8 is provided between the data input unit 11 and the correction coefficient calculating unit 12. This correction requirement judging unit 14 judges that correction is necessary and activates the correction coefficient calculating unit 12 and the corrected IBIS data generating unit 13 only when the desired power supply voltage (V1) does not coincide with the specific power supply voltage (V0) when obtaining the output electrical characteristic read at the data input unit 11. On the other hand, when both power supply voltages coincide, the correction of the output electrical characteristic is unnecessary, therefore the IBIS data is input to the modeling unit 24 as it is while bypassing these correction coefficient calculating unit 12 and the corrected IBIS data generating unit 13.

Further, the corrected IBIS library 15 shown in FIG. 1 and FIG. 8 stores the corrected IBIS data generated by the corrected IBIS data generating unit 13 (FIG. 1) so that they can be freely read out and can provide them for utilization at the outside. When there are not only one, but several users using the waveform simulation device 20, the corrected IBIS data calculated by any one user is advantageously stored as common data for the other users and can be utilized by any user at any time. The corrected IBIS library 15 is provided along with this idea.

The above-explained IBIS correction tool 10 can be utilized while being assembled in not only the above-explained waveform simulation device 20, but also various simulation tools for circuit design and circuit analysis using the output voltage-current characteristic as a parameter.

While the invention has been described with reference to specific embodiments chosen for purpose of illustration, it should be apparent that numerous modifications could be made thereto by those skilled in the art without departing from the basic concept and scope of the invention.

The invention claimed is:

1. An IBIS correction computation apparatus converting IBIS data provided for a specific power supply voltage for a specific semiconductor device to corrected IBIS data corrected so as to match with a desired power supply voltage different from said specific power supply voltage for said specific semiconductor device, comprising:
   a data input unit for reading all data for an electrical characteristic of an output of said specific semiconductor device defined by said IBIS data as numerical data consisting of x-y coordinates;
   a correction coefficient calculating unit for calculating a relative ratio of said numerical data of the x-y coordinates read at said data input unit for said specific power supply voltage and numerical data represented on the same x-y coordinates for said desired power supply voltage as a correction coefficient; and
   a corrected IBIS data generating unit for converting IBIS data corresponding to said specific power supply voltage on said x-y coordinates to said corrected IBIS data corrected so as to match with said desired power supply voltage.

2. The IBIS correction computation apparatus as set forth in claim 1, wherein
   said correction coefficient calculating unit represents said numerical data consisting of the x-y coordinates read at said data input unit as a reference vector using an origin of the x-y coordinates as the base point and uses the relative ratio between a magnitude of the desired vector corresponding to said desired power supply voltage on the same x-y coordinates and the magnitude of the reference vector as the correction coefficient, and wherein said corrected TBIS data generating unit converts the IBIS data corresponding to said specific power supply voltage to said corrected IBIS data corresponding to said desired power supply voltage based on said correction coefficient and an angle of said reference vector relative to said origin.

3. The IBIS correction computation apparatus as set forth in claim 2, wherein:

said data input unit reads said specific power supply voltage as Vddn, an output voltage thereof as Vn, and an output current thereof as In for said electrical characteristic of the output, said correction coefficient calculating unit calculates a magnitude dn of said reference vector as $dn=\sqrt{(Vn^2+In^2)}$, calculates an angle $\theta n$ of said reference vector relative to said origin as $\theta n=\tan^{-1}(In/Vn)$, and, when said desired power supply voltage is Vddm, finds said relative ratio as Vddm/Vddn, and said corrected IBIS data generating unit first calculates the magnitude dm of said desired vector as $dm=(Vddm/Vddn) \times dn$ and generates an output voltage Vm and an output current Im as the corrected IBIS data corresponding to said desired power supply voltage as $Vm=dm^2 \times \cos \theta n$ and $Im=dm \times \sin \theta n$.

4. The IBIS correction computation apparatus as set forth in claim 1, further comprising:

a correction requirement judging unit provided between said data input unit and said correction coefficient calculating unit, the correction requirement judging unit judging that the correction is necessary and activating said correction coefficient calculating unit and said corrected IBIS data generating unit only when said desired power supply voltage does not coincide with said specific power supply voltage when obtaining said electrical characteristic of the output read at said data input unit.

5. The IBIS correction computation apparatus as set forth in claim 1, further comprising a corrected IBIS library for storing the corrected IBIS data generated by said corrected IBIS data generating unit so that it can be freely read out and providing it for utilization at the outside.

6. An IBIS correction method, performed in a computation apparatus, converting IBIS data provided for a certain specific power supply voltage for a certain semiconductor device to corrected IBIS data corrected so as to match with a desired power supply voltage different from that specific power supply voltage for that semiconductor device, comprising:

a preliminary step of providing the computation apparatus;

a first step of reading all data for an electrical characteristic of the output of said semiconductor device defined by said IBIS data as numerical data consisting of x-y coordinates;

a second step of calculating a relative ratio between said numerical data consisting of the x-y coordinates read at said first step for said specific power supply voltage and numerical data represented on the same x-y coordinates for said desired power supply voltage as a correction coefficient; and a third step of converting the IBIS data corresponding to said specific power supply voltage to corrected IBIS data corrected so as to match with said desired power supply voltage according to said correction coefficient calculated at said second step.

7. The IBIS correction method as set forth in claim 6, further comprising steps of providing a display coupled to the computation apparatus and displaying the corrected IBIS data to a user.

8. A waveform simulation device comprising:

a modeling unit receiving as input IBIS data and interconnect data provided from the outside and preparing a device model and an interconnect model;

a waveform simulating unit receiving as input information of said device model and interconnect model prepared at said modeling unit and simulating an output waveform of a semiconductor device; and a waveform display unit for providing a simulated output waveform to a user, which forms a model generating unit including said modeling unit, introduces an IBIS correction tool to an input side of said IBIS data in the model generating unit, and has the IBIS correction tool convert IBIS data provided for a specific power supply voltage for a certain semiconductor device to corrected IBIS data corrected so as to match with a desired power supply voltage different from said specific power supply voltage for said specific semiconductor device.

9. A computer readable medium having a program stored therein to cause a computer to execute operations for converting IBIS data provided for a specific power supply voltage for a specific semiconductor device to corrected IBIS data corrected so as to match with a desired power supply voltage different from said specific power supply voltage for said specific semiconductor device, said operations comprising:

reading all data for an electrical characteristic of the output of said semiconductor device defined by said IBIS data as numerical data consisting of x-y coordinates;

calculating a relative ratio between said numerical data consisting of x-y coordinates read at said reading operation for said specific power supply voltage and numerical data represented on the same x-y coordinates for said desired power supply voltage as a correction coefficient; and converting the IBIS data corresponding to said specific power supply voltage to corrected IBIS data corrected so as to match with said desired power supply voltage according to said correction coefficient calculated at said calculating operation.

* * * * *